United States Patent [19]

Nishikawa et al.

[11] 4,321,560
[45] Mar. 23, 1982

[54] OSCILLATOR USING DIELECTRIC RESONATOR

[75] Inventors: Toshio Nishikawa, Nagaokakyo; Yoji Ito, Takatsuki; Youhei Ishikawa; Sadahiro Tamura, both of Kyoto, all of Japan

[73] Assignee: Murata Manufacturing Co., Ltd., Japan

[21] Appl. No.: 123,015

[22] Filed: Feb. 20, 1980

[30] Foreign Application Priority Data

Mar. 1, 1979 [JP] Japan ............................. 54-24752

[51] Int. Cl.³ .............................................. H03B 5/18
[52] U.S. Cl. ................................... 331/99; 331/117 D
[58] Field of Search .................... 331/96, 99, 107 DP, 331/107 SL, 107 C, 117 D; 333/219, 227, 230, 231, 232, 233

[56] References Cited

U.S. PATENT DOCUMENTS 4,079,341  3/1978  Linn et al. ............................. 331/96
4,149,127  4/1979  Murakami et al. .................... 331/96
4,187,476  2/1980  Shinkawa et al. ............... 331/117 D

FOREIGN PATENT DOCUMENTS 127059   9/1976  Fed. Rep. of Germany .
122900  11/1976  Fed. Rep. of Germany .
53-83556  7/1978  Japan .
53-101817 8/1978  Japan ............................. 331/117 D Primary Examiner—Siegfried H. Grimm

[57] ABSTRACT

An oscillator comprises two leakage lines extending in parallel with a dielectric resonator positioned therebetween, within a housing made of metal. The dielectric resonator is electromagnetically coupled to the respective leakage lines with a predetermined coupling degree through coupling gaps formed between the dielectric resonator and the respective leakage lines. The dielectric resonator is disposed at an optimum position for establishing an oscillating condition of the oscillator. Preferably, the dielectric resonator is movable in the length direction of the leakage lines.

13 Claims, 6 Drawing Figures

OSCILLATOR USING DIELECTRIC RESONATOR

BACKGROUND OF THE INVENTION

1. Field of the Invention

The present invention relates to an oscillator using a dielectric resonator. More specifically, the present invention relates to a microwave oscillator using a dielectric resonator in a feedback loop of an amplifier.

2. Description of the Prior Art

An oscillator is provided by forming a positive feedback loop between, for example, a drain circuit and a source circuit, in an amplifying element such as a field effect transistor. Recently, an oscillator using a dielectric resonator as a feedback loop has been proposed and put into practical use by virtue of an excellent frequency stability. Such a microwave oscillator using a dielectric resonator is disclosed in, for example, U.S. Pat. No. 4,079,341 issued Mar. 14, 1978 to Donald Floyd Linn et al and entitled "MICROWAVE OSCILLATOR HAVING FEEDBACK COUPLED THROUGH A DIELECTRIC RESONATOR". Another disclosure of interest in this connection is also seen in IEEE TRANSACTIONS ON MICROWAVE THEORY AND TECHNIQUES, March, 1978, Vol. MTT-26, No. 3, entitled "A Highly Stabilized Low-Noise GaAs FET Integrated Oscillator with a Dielectric Resonator in the C Band". Such a microwave oscillators as disclosed in the above referenced U.S. patent and the above referenced paper employ a positive feedback loop implemented by a dielectric resonator coupled between the output and input of an amplifying element.

FIG. 1 is a view explaining a fundamental concept of a microwave oscillator employing a dielectric resonator as a positive feedback loop. Referring to FIG. 1, a dielectric resonator 11 is disposed within a casing 10 and a pair of exciting bars 12 and 13 are also housed in the casing 10 so as to be opposed to each other with the above described dielectric resonator 11 disposed therebetween. One exciting bar is coupled to, for example, a coaxial cable 14 through a connector, not shown. The coaxial cable 14 is connected to the input of an amplifier 15. The output of the amplifier 15 is connected by means of a coaxial cable 16 to a coaxial directional coupler or an RF monitor tee 17 as an example of a T type branch. A portion of the output from the amplifier 15 fed to the RF monitor tee 17 is withdrawn as a high frequency signal output of the oscillator. A portion of the output of the RF monitor tee 17 is also applied to a coaxial cable 18, which is connected to the other exciting bar 13 through a connector, not shown. With such an oscillator structure, a portion of the high frequency signal output of the amplifier 15 is fedback to the input of the amplifier 15 through the dielectric resonator 11, to thereby cause oscillation. The phase of the high frequency signal fedback to the input of the amplifier 15 is determined as a function of a phase difference between the exciting bars 12 and 13, the lengths of the coaxial cables 14, 16 and 18 and a phase difference between the input and output of the amplifier 15. The respective coupling coefficients between the exciting bar 12 and the dielectric resonator 11 and the exciting bar 13 and the dielectric resonator 11 are determined as a function of a gap g1 between the dielectric resonator 11 and the exciting bar 12 and a gap g2 between the dielectric resonator 11 and the exciting bar 13, respectively. Accordingly, in adjusting the phase by changing the amplification degree of the amplifier 15, the oscillation frequency and the like, it is necessary to change the lengths of the coaxial cables 14, 16 and 18 included in the feedback loop. Furthermore, in adjusting an attenuation degree of the feedback loop, it is necessary to change the gaps g1 and g2 between the exciting bars 12 and 13 and the dielectric resonator 11, which further necessitates a change in the size of the casing 10. In addition, since the dielectric resonator 11, the coaxial cables 14, 16 and 18 for phase adjustment and the amplifier 15 are implemented as separate blocks, a disadvantage results that the oscillator is large. Furthermore, a coaxial directional coupler, an RF monitor tee or the like 17 is required in order to withdraw a portion of the high frequency signal output of the amplifier 15 for feedback purposes. However, when the output signal for feedbacking is withdrawn by such RF monitor tee, another disadvantage results that a feedback gain is attenuated by approximately 10 to 20 dB, which necessitates an increased gain by the amplifier 15 accordingly.

SUMMARY OF THE INVENTION

In order to eliminate the above described disadvantages and problems, the present invention employs a dielectric resonator disposed between two parallely extending leakage lines. The dielectric resonator is located at a given position in the direction of the leakage lines, so that a predetermined oscillating condition may be established.

According to the present invention, phase adjustment for establishing an oscillating condition may be achieved by merely changing a mounting position of the dielectric resonator and therefore even oscillators of different oscillation frequencies can be manufactured with ease. Furthermore, such oscillators of different oscillation frequencies can be manufactured in the same size. Thus, the present invention is particularly suited for production of a small number of each type of a large number of types of oscillators. Furthermore, since the present invention is adapted such that the dielectric resonator and the leakage lines are electromagnetically coupled directly through a coupling path, it is no longer necessary to employ a coaxial directional coupler, an RF monitor tee or the like as is employed in the prior art resonators. Therefore, reduction of the feedback gain is decreased and a sufficient oscillation output can be attained even using an amplifier of a smaller gain.

In a preferred embodiment of the present invention, a coupling gap is formed between the dielectric resonator and the respective leakage lines. Accordingly, an attenuation degree of the feedback loop can be adjusted with ease by simply changing the length of the coupling gap. By forming such coupling gap in a strip shape along the length direction of the leakage lines, a predetermined coupling degree can be attained with ease even in moving the dielectric resonator along the leakage lines for the purpose of phase adjustment.

In a further preferred embodiment of thep present invention, since the dielectric resonator, the amplifier, the leakage lines, and the like are housed in a single housing or casing, the oscillator can be made compact with ease and can be handled with ease.

Accordingly, a principal object of the present invention is to provide an oscillator using a dielectric resonator, which is simple in structure.

Another object of the present invention is to provide an oscillator using a dielectric resonator, which is easy of adjustment.

A further embodiment of the present invention is to provide an oscillator using a dielectric resonator, which is suited for production of a smaller number of oscillators of an increased number of kinds.

These objects and other objects, features, aspects and advantages of the present invention will become more apparent from the following detailed desription of the present invention when taken in conjunction with the accompanying drawings.

BRIEF DESCRIPTION OF THE DRAWINGS

FIGS. 2A, 2B and 2C are views for showing a structure of one embodiment of the present invention, wherein FIG. 2A is a view showing a cross section of the embodiment, FIG. 2B is a view showing another cross section taken along the line IIB—IIB in FIG. 2A, and FIG. 2C is a view showing a further cross section taken along the IIC—IIC in FIG. 2A.

DESCRIPTION OF THE PREFERRED EMBODIMENTS

Figure 1:
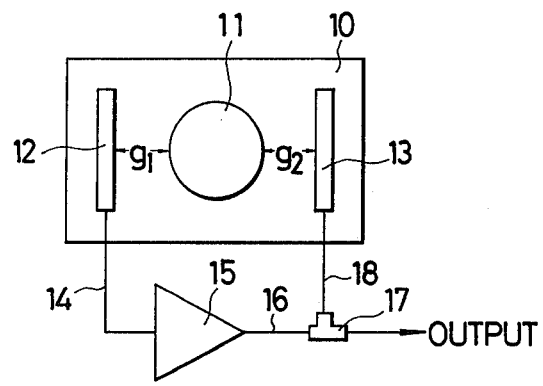
FIG. 1 is a view depicting a concept of an oscillator including a dielectric resonator interposed in a feedback loop, in which the present invention can be advantageously employed.
Figure 2A:
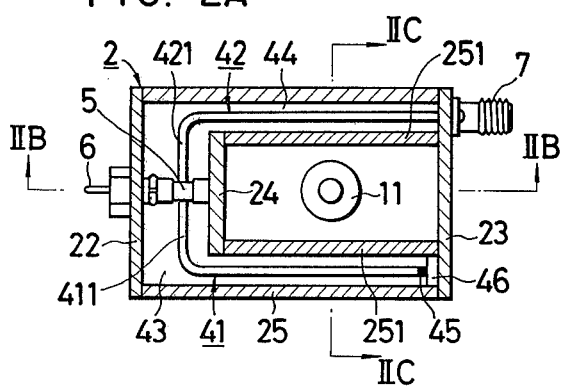
Figure 2B:
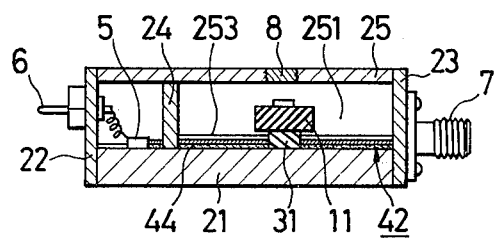
Figure 2C:
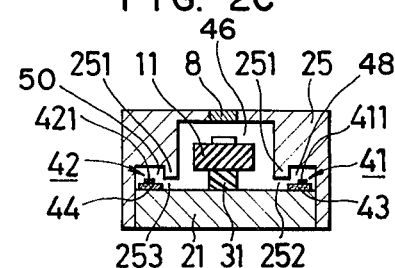

FIGS. 2A, 2B and 2C are views illustrating one embodiment of the present invention, wherein FIG. 2A is a first cross section of the embodiment, FIG. 2B is a second cross section taken along the line IIB—IIB in FIG. 2A, and FIG. 2C is a further cross section taken along the line IIC—IIC in FIG. A.

Referring to FIGS. 2A, 2B and 2C, the embodiment shown comprises a casing 2 made of an electrically conductive material which comprises a bottom plate 21, end plates 22 and 23, a partitioning plate 24 and a cover 25. The cover 25 is structured such that a first longitudinal cavity space of a larger height is formed extending in the longitudinal direction of the cover 25 at the central portion defined by both side cavity walls 251 and second longitudinal cavity spaces of a smaller height are formed extending in the longitudinal direction of the cover 25 at both sides of the first longitudinal cavity space, with the bottom edges of both side walls 251 being slightly extended downwardly. When the bottom plate 21 is mounted to the cover, therefore, a first main cavity 46 is formed corresponding to the first longitudinal cavity space at the central portion and second auxiliary cavities 48, 50 are formed corresponding to the second longitudinal cavity spaces, while coupling gaps 252 and 253 each having a predetermined width are formed between both bottom extensions of the cavity walls 251 and the bottom plate 21. A dielectric resonator 11 is disposed on the bottom plate 21 at the central portion corresponding to the first cavity 46 through a supporting base 31 made of an insulating material. An input stripline 41 and an output stripline 42, serving as leakage lines, are formed in parallel on the bottom plate at the positions corresponding to the auxiliary cavities 48, 50, respectively, with the dielectric resonator 11 disposed therebetween. These striplines 41 and 42 comprise ceramic substrates 43 and 44 which may be formed of alumina, on which strip conductors 411 and 421 are formed, respectively. The strip conductor 411 of the input stripline 41 and the strip conductor 421 of the output stripline 42 are bent at one end of each of the lines at substantially a right angle, so that each of the bent end portions may be connected to the input and the output of the amplifier 5, respectively.

The amplifier 5 may be implemented by a field effect transistor. In such a case, the gate electrode of the field effect transistor is connected to the strip conductor 411 of the input stripline 41 and the source electrode is connected to ground through a parallel connection of a resistor and a capacitor, not shown. The drain electrode of the field effect transistor is connected to the strip conductor 421 of output stripline 42, while power is supplied from a voltage source terminal 6 provided on the side plate 22. The other end of the strip conductor 411 of th input stripline 41 is connected to the ground terminal 46 through a matching resistor 45 of 50Ω. The purpose of matching resistor 45 is to prevent a reflective wave, and thus a standing wave, from occurring on the input stripline 41 when the input stripline 41 is coupled to the dielectric resonator 11. The other end of the strip conductor 421 of the output stripline 42 is connected to the output connector 7 provided on the side plate 23.

The purpose of coupling gaps 252 and 253 is to electromagnetically couple the input stripline 41 and the output stripline 42, respectively, and the dielectric resonator 11. Preferably, a frequency adjusting screw 8 may be provided at the upper position of the cover 25 facing the dielectric resonator 11.

With such a structure, when a source voltage is supplied to the amplifier 5 through the voltage source terminal 6, the high frequency signal output from the amplifier 5 is withdrawn from the output connector 7 through the strip conductor 421 of the output stripline 42, when a portion of the high frequency signal output is electromagnetically coupled to the dielectric resonator 11 by virtue of leakage through the coupling gap 253. Furthermore, the high frequency signal output is electrically coupled between the dielectric resonator 11 and the strip conductor 411 of the input stripline 41 through the coupling gap 252. Thus, the high frequency signal output leaked from the output strip conductor 421 is electromagnetically coupled to the dielectric resonator 11 and electromagnetic coupling is also attained between the dielectric resonator 11 and the input strip conductor 411. Accordingly, the leaked high frequency signal output is fedback to the input of the amplifier 5. As a result, the oscillator oscillates.

Figure 3A:
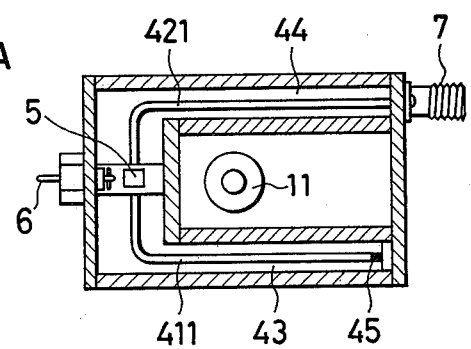
FIGS. 3A and 3B are views showing a state in which the position of the dielectric resonator has been changed for the purpose of phase adjustment.
Figure 3B:
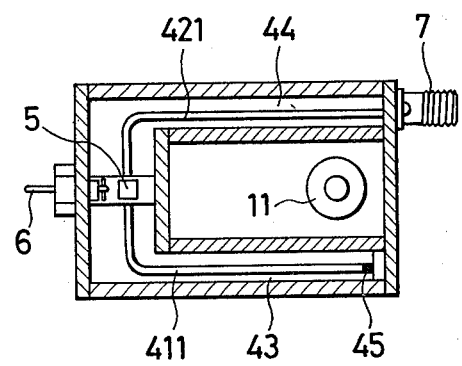

FIGS. 3A and 3B are views depicting a method for adjusting the phase of the oscillator of one embodiment of the present invention. With the inventive oscillator, one of the required oscillating conditions is that the phase sum obtained by adding the delay phase by means of the amplifier 5 to the phase of the fedback input signal is the same as the phase of the signal appearing at the output connector 7. In other words, a positive feedback loop must be formed. To that end, with the inventive oscillator, the phase is adjusted by moving the position of the dielectric resonator 11 in parallel with the striplines 41 and 42 so as to be movable toward or away from the amplifier 5, whereby the line lengths of the striplines 41 and 42 constituting a portion of the feedback loop may be changed. More specifically, by moving the dielectric resonator 11 toward the amplifier 5 as shown in FIG. 3A, the line lengths of the striplines 41 and 42 are shortened, so that the phase can be advanced. On the other hand, by moving the dielectric resonator 11 away from the amplifier 5 as shown in FIG. 3B, the line lengths of the striplines 41 and 42 are lengthened, whereby the phase can be delayed. If and when the position of the dielectric resonator 11 is adjusted to be of the optimum phase and the amplification degree of the amplifier 5 is larger than the attenuation degree of the feedback loop, then the oscillating condition is met and oscillation occurs. Therefore, the dielectric resonator 11 is provided to be displaceable in the length direction of the striplines 41 and 42. The attenuation degree of the feedback loop becomes minimal in the inherent central frequency of the dielectric resonator 11. Accordingly, by adjusting the coupling gaps 252 and 253 such that the above described minimum attenuation degree may be slightly smaller than the amplification degree of the amplifier 5, the frequency range meeting the oscillating condition of the oscillator can be narrowly restricted. Accordingly, the oscillator oscillates in the vicinity of the inherent resonance frequency of the dielectric resonator 11.

Meanwhile, although in the above described embodiment the other end of the strip conductor 411 of the input stripline 41 is connected to the ground through a matching resistor 45, connection of the input strip conductor 411 through the matching resistor 45 decreases the gain of the feedback loop by approximately 3 dB and therefore in the case where the gain of the amplifier 5 is lower, the other end of the input strip conductor 411 may be opened or directly grounded.

In the above described embodiment the coupling gaps 252 and 253 are formed to electromagnetically couple the input stripline 41 and the dielectric resonator 11 and the output stripline 42 and the dielectric resonator 11, respectively; however, the coupling gap may be formed only at one side or may dispensed with.

Meanwhile, the coupling degree can be changed by changing the height of the inner spaces where the respective strip conductors 411 and 412 are located. However, since a decrease of the height decreases the characteristic impedance of the stripline, it is more preferred to change the coupling degree by means of the coupling gap.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oscillator using a dielectric resonator, comprising:
    two parallelly extending leakage lines;
    an amplifier having an input connected to one end of one of said two leakage lines and an output connected to one end of the other of said two leakage lines, a matching resistor connected to a second end of that one of said leakage lines which is connected to the input of said amplifier;
    a dielectric resonator disposed between said two leakage lines at a position which electromagnetically couples said two leakage lines to said resonator and establishes a feedback path between said leakage lines so as to cause said oscillator to oscillate; and
    output withdrawing means for withdrawing the output of said oscillator from the output of said amplifier.

2. An oscillator in accordance with claim 1, further comprising coupling adjusting means formed between at least one of said two leakage lines and said dielectric resonator for determining the coupling therebetween.

3. An oscillator in accordance with claim 2, wherein said coupling adjusting means comprises a slit gap.

4. An oscillator in accordance with claim 3, wherein said slit gap is formed along the length direction of said at least one of said leakage lines.

5. An oscillator in accordance with claim 1, 2, 3 or 4, wherein said leakage lines comprise striplines.

6. An oscillator using a dielectric resonator, said oscillator comprising:
    a housing made of an electrically conductive material and including a main cavity and first and second auxiliary cavities formed on opposite sides of said main cavity;
    first and second leakage lines located in said first and second auxiliary cavities, respectively, said first and second leakage lines extending parallel to each other;
    an amplifier having an input connected to one end of said first leakage line and an output coupled to one end of said second leakage line;
    a dielectric resonator located in said main cavity between said first and second leakage lines, said resonator being movable within said main cavity in a direction parallel to said parallel extending leakage lines; and
    said dielectric resonator being electromagnetically coupled to said first and second leakage lines via respective slits formed in said housing such that a feedback path is formed between said resonator and said leakage lines and said oscillator oscillates when a power is applied to said amplifier.

7. An oscillator in accordance with claim 6, wherein the dimensions of said slits are selected to optimize the coupling degree between the first and second leakage lines and said dielectric resonator.

8. An oscillator in accordance with claim 7, wherein said slits extend along a direction parallel to said parallel leakage lines.

9. An oscillator in accordance with claim 6, 7 or 8, wherein a second end of said first leakage line connected to the input of said amplifier is connected to said housing through a matching resistor.

10. An oscillator in accordance with claim 9, further comprising frequency adjusting means provided in said housing at a position corresponding to said dielectric resonator and movable toward or away from said dielectric resonator in a manner which adjusts the oscillating frequency of said oscillator.

11. An oscillator in accordance with claim 10, wherein said frequency adjusting means comprises a screw coupled to said housing.

12. An oscillator in accordance with claim 6, 7 or 8, further comprising frequency adjusting means provided in said housing at a position corresponding to said dielectric resonator and movable toward or away from said dielectric resonator in a manner which adjusts the oscillating frequency of said oscillator.

13. An oscillator in accordance with claim 12, wherein said frequency adjusting means comprises a screw coupled to said housing.

* * * * *